US005925227A

United States Patent [19]

Kobayashi et al.

[11] Patent Number: 5,925,227

[45] Date of Patent: Jul. 20, 1999

[54] MULTICHAMBER SPUTTERING APPARATUS

[75] Inventors: Masahiko Kobayashi, Kanagawa; Masahito Ishihara, Tokyo; Nobuyuki Takahashi, Kanagawa, all of Japan

[73] Assignee: Anelva Corporation, Tokyo, Japan

[21] Appl. No.: 08/859,077

[22] Filed: May 20, 1997

[30] Foreign Application Priority Data

May 21, 1996 [JP] Japan .................................... 8-150043

[51] Int. Cl.[6] .................................................... C23C 14/56

[52] U.S. Cl. ............................... 204/298.25; 204/298.07; 204/298.09; 204/298.15

[58] Field of Search ......................... 204/298.07, 298.09, 204/298.15, 298.25, 298.26; 118/719, 724, 725, 729

[56] References Cited

U.S. PATENT DOCUMENTS 4,978,412 12/1990 Aoki et al. .......................... 204/298.15
4,994,162 2/1991 Armstrong et al. ............... 204/192.12
5,067,218 11/1991 Williams ................................ 118/729
5,267,607 12/1993 Wada ................................. 204/298.09
5,310,410 5/1994 Begin et al. ............................ 118/719
5,504,043 4/1996 Ngan et al. ......................... 204/192.17
5,618,350 4/1997 Ishikawa et al. ....................... 118/728

FOREIGN PATENT DOCUMENTS 60-136314 7/1985 Japan ............................... 204/298.09
5-152425 6/1993 Japan ............................... 204/298.09

*Primary Examiner*—Nam Nguyen
*Assistant Examiner*—Rodney G. McDonald
*Attorney, Agent, or Firm*—Sughrue, Mion, Zinn, Macpeak & Seas, PLLC

[57] ABSTRACT

A multichamber sputtering apparatus which is used for manufacturing a semiconductor device and the like. In the apparatus, a plurality of sputter chambers and a degas chamber are airtightly connected to and arranged around a center transfer chamber, and processes including sputtering are continuously conducted in a vacuum. A plurality of heat stages are disposed in the degas chamber so that a plurality of substrates are simultaneously heated. In each heat stage, as required, a heating gas introducing unit for introducing a heating gas with causing the heating gas to make contact with the rear face of the substrate, a pressing mechanism which presses the substrate against the heat stage so as to enhance the surface contact between the heat stage and the substrate, or an electrostatic chucking mechanism is disposed.

10 Claims, 5 Drawing Sheets

1B
X
1C
1A
1D
6
Y
51
X
5
Y
51
4
10
10
2
21
31
3

14
15
12
11
10
131
13
1C
101
411
41
4
502
501
10
511
51
5
S N
N S
S N

MULTICHAMBER SPUTTERING APPARATUS

BACKGROUND OF THE INVENTION

1. Field of the Invention

The invention relates to an improvement of the productivity of a multichamber sputtering apparatus which is used for manufacturing a semiconductor device and the like.

2. Description of the Related Art

Film deposition techniques include vacuum evaporation, sputtering, chemical vapor deposition (CVD) and the like. In a process of manufacturing a semiconductor device, sputtering is frequently used to deposit a film for a wiring material and the like. In semiconductor devices such as a memory device and a logic device, as the degree of integration of such a device is increased and the performance is further improved, the request for improved reliability of the device is largely expanding. In order to meet the request, wiring processes by sputtering and the like have been remarkably advanced.

Specifically, in order to improve the resistance to electro migration, AlSi which has been used as a wiring material is replaced with an AlSiCu material containing Cu. Furthermore, it has been requested to form a Ti/TiN lamination film as a diffusion barrier film (barrier film) for an underlying layer and a wiring layer, between an Si foundation and an AlSiCu wiring. A process of depositing a film of an Al wiring material on such a barrier film is enabled by a sputtering apparatus of the multichamber type in which different film depositing processes can be consistently conducted in a vacuum.

On the other hand, current semiconductor devices are highly integrated having narrow wiring patterns and many layers. Under this situation, a conventional sputtering technique has reached its limitation with respect to the film deposition of a barrier film and a wiring material in a fine hole. Therefore, various attempts to improve a sputtering method have been made. For sputtering of an Al wiring material, the high-temperature sputtering method has been developed. In this method, sputtering is conducted at a substrate temperature in the vicinity of the melting point of an Al material, whereby the Al material is caused to flow into a fine hole so as to realize the filling process.

According to the method, it is expected to apply a sputtering technique to a manufacture of a memory device of 64 to 256 Mbits, and further that of 1 Gbits in which the wiring width is 0.18 micron-meters.

In this way, a film deposition adapted to a high degree of integration of a device requires a sputtering method using a high-temperature process. However, such a method remains to have a problem from the viewpoint of productivity. Namely, the method has a problem in that the period required for a process of degassing a substrate before the high-temperature film deposition is to be shortened.

As described above, a high-temperature process for Al (400 to 500° C.) uses the fluidity of Al. However, it is known that, when impurities such as water and oxygen molecules are deposited or precipitated on the surface of Al on the substrate during sputtering, the fluidity is largely impaired. The reduction of the impurity level during Al sputtering is a very important technique. To comply with this, water and oxygen molecules which may separate from the substrate during sputtering must be previously removed away by heating the substrate before the high-temperature film deposition of Al. Consequently, a process called degas is essential.

During the degas process, the temperature of the substrate must be higher than that during the high-temperature film deposition of Al, because of the following reason. When the degas temperature is lower than the temperature during the high-temperature film deposition of Al, the impurities are released from the substrate into the Al film during the deposition of the Al film, and hence the fluidity of Al is largely impaired, so that the filling process is not accomplished.

Because of the above-mentioned reason, usually, the degas temperature is set to be at a sufficiently high temperature or 450 to 600° C. From the viewpoint of productivity, however, a high degas temperature produces a problem of a very low efficiency because of the following reason. A process in-which the temperature of the substrate is raised to the above-mentioned high value and maintained to this value to sufficiently degas requires a prolonged period, with the result that the productivity as a whole is lowered.

SUMMARY OF THE INVENTION

In order to solve the problem discussed above, the invention provides a multichamber sputtering apparatus comprising a transfer chamber and a plurality of process chambers which are airtightly connected to and arranged around the transfer chamber, in which processes are continuously conducted in a vacuum, the process chambers comprising: a sputter chamber for sputtering; and a degas chamber for degassing a substrate, the degas chamber being provided with a plurality of heat stages so as to simultaneously heat a plurality of substrates.

DETAILED DESCRIPTION OF THE PREFERRED EMBODIMENTS

Hereinafter, embodiments of the invention will be described.

Figure 1:
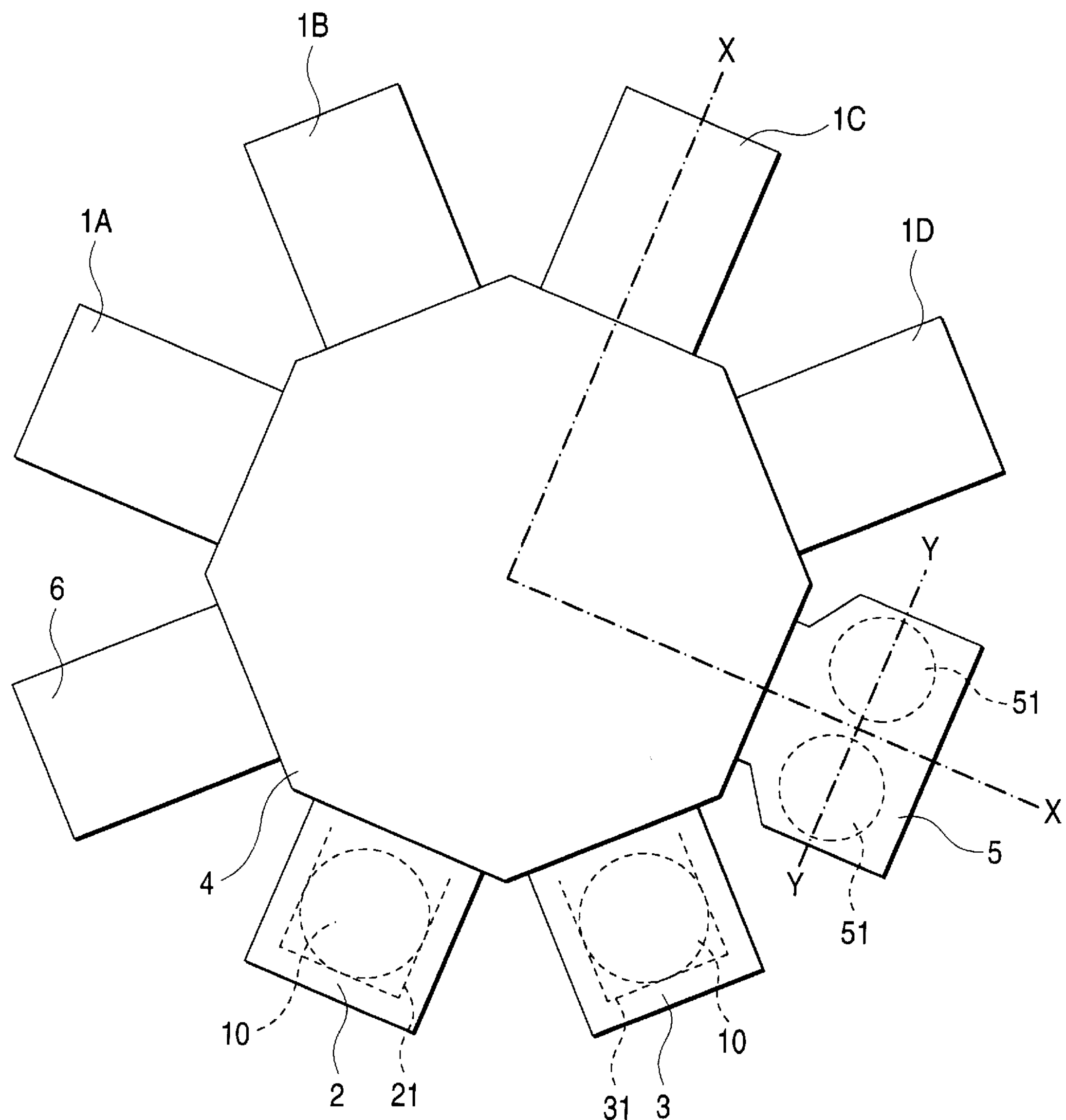
FIG. 1 is a plan view schematically illustrating the configuration of a multichamber sputtering apparatus of a first embodiment of the invention.

FIG. 1 is a plan view schematically illustrating the configuration of a multichamber sputtering apparatus of a first embodiment of the invention.

As shown in FIG. 1, the sputtering apparatus of the embodiment is configured as a system of the multichamber type which comprises a transfer chamber 4 disposed at the center, and a plurality of chambers arranged around the transfer chamber 4. The surrounding chambers are airtightly connected to the center transfer chamber 4 via respective gate valves which are not shown. Each of the chambers is provided with an exclusive or common exhaust system (not shown in FIG. 1) so as to be exhausted to a predetermined pressure.

In the transfer chamber 4, a transfer robot 41 (shown in FIG. 2) which can automatically transfer a substrate 10 in a vacuum is disposed as a transferring mechanism. Among the surrounding chambers, two adjacent chambers are used as a load-lock chamber 2 and an unload-lock chamber 3, respectively. Among the other surrounding chambers (process chambers), one is a degas chamber 5, another one is an etching chamber 6, and the remaining four chambers are sputter chambers 1A, 1B, 1C, and 1D.

In the apparatus of the embodiment which is a system configured as described above, a predetermined number (about 25) of substrates 10 on which the film depositing process is to be conducted are housed in a substrate cassette 21, and then placed in the load-lock chamber 2. The substrates 10 are taken out one by one by the transfer robot 41 from the substrate cassette 21 in the load-lock chamber 2 and then sequentially transferred to the objective process chambers. After conducting various processes including the film depositing process, the substrates are returned to the unload-lock chamber 3. In the unload-lock chamber 3, a substrate cassette 31 is similarly disposed so that a predetermined number of the substrates 10 which have undergone the processes can be housed in the cassette.

The apparatus of the embodiment is mainly characterized in the degas chamber 5. Therefore, the apparatus will be described with placing stress on the degas chamber 5.

Figure 2:
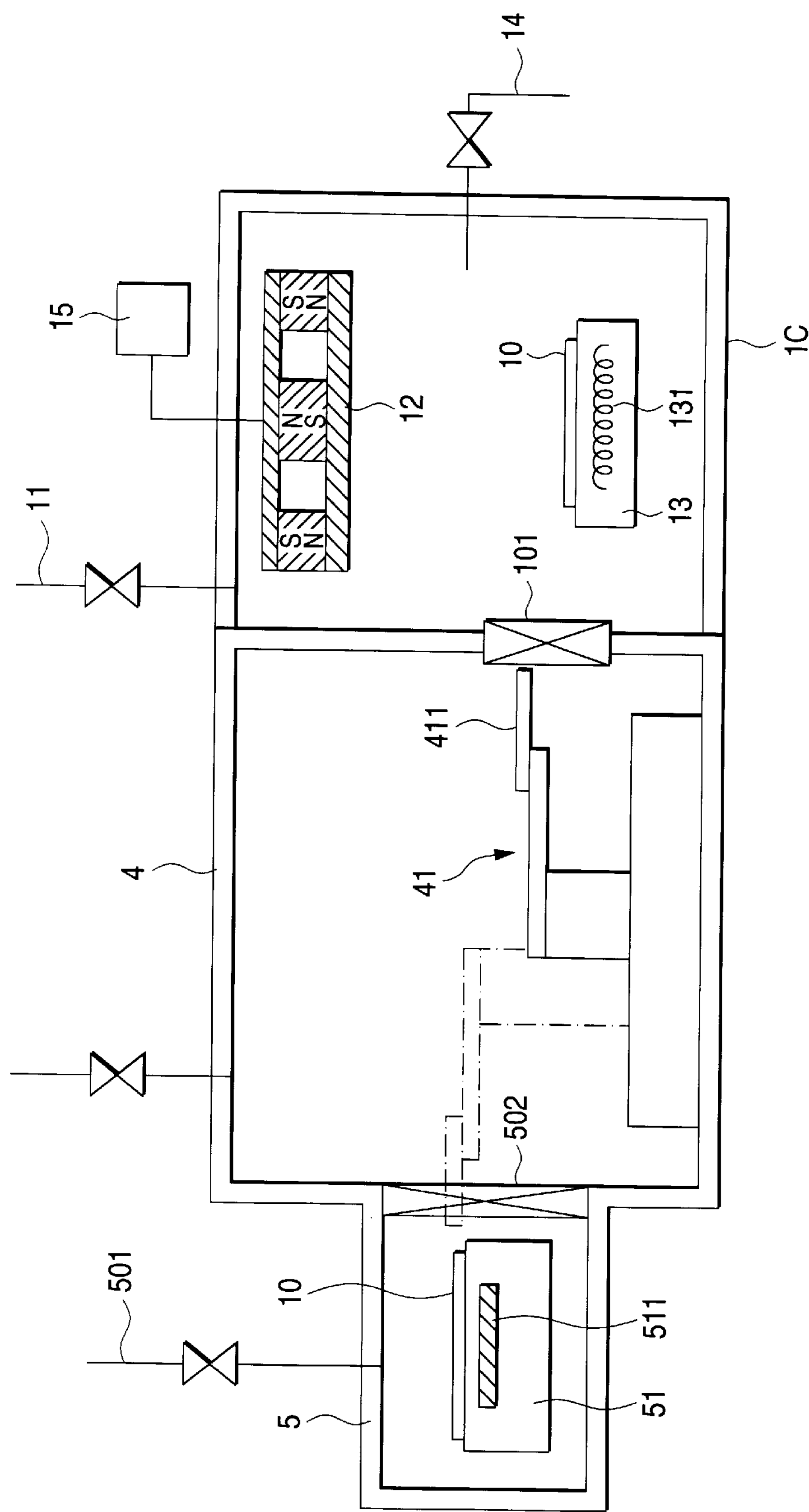
FIG. 2 is a schematic section view of the apparatus taken along the line X—X of FIG. 1.
Figure 3:
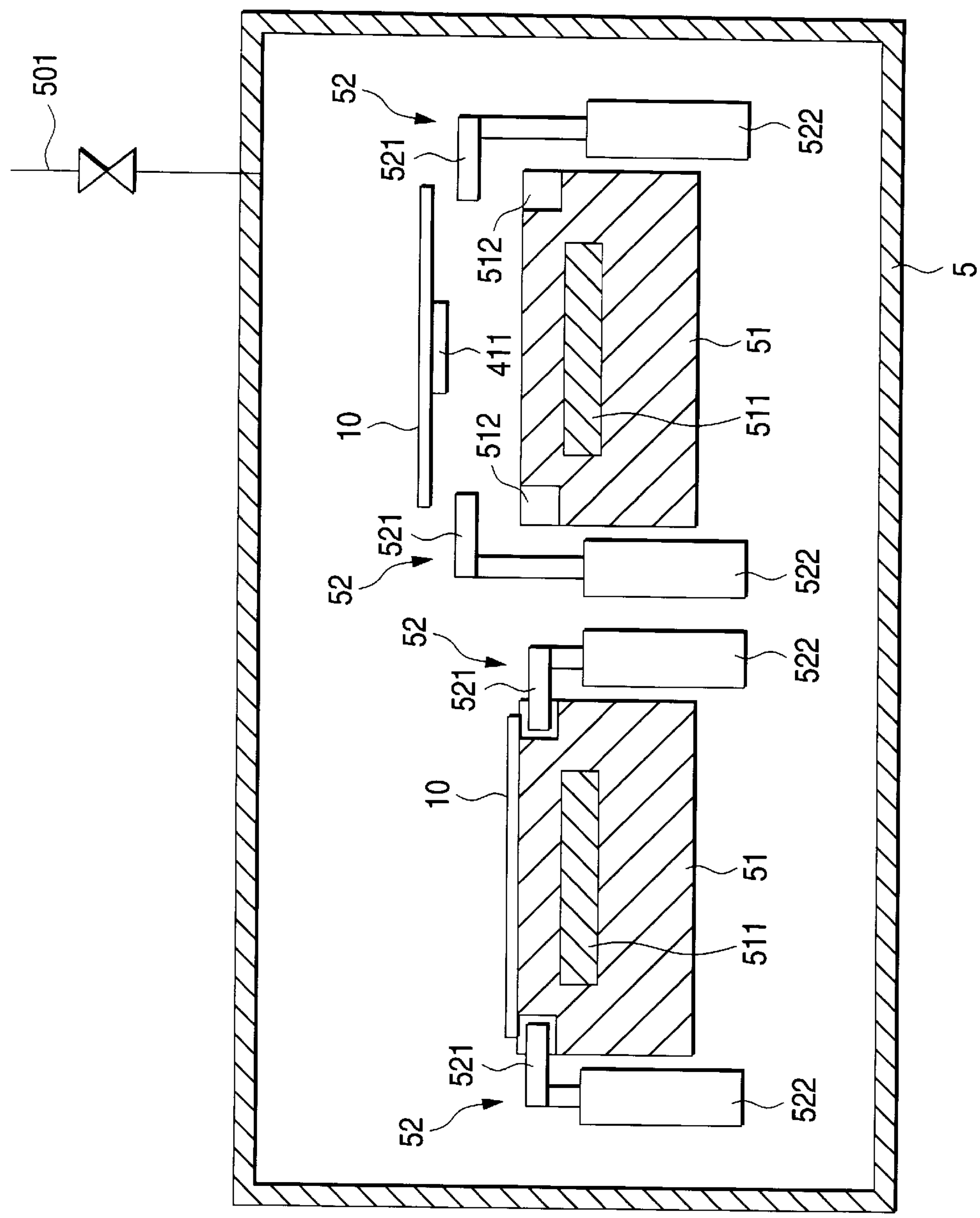
FIG. 3 is a schematic section view of a degas chamber taken along the line Y—Y of FIG. 1.

FIG. 2 is a schematic section view of the apparatus taken along the line X—X of FIG. 1, and FIG. 3 is a schematic section view of the apparatus taken along the line Y—Y of FIG. 1.

The degas chamber 5 is a vacuum vessel having an exhaust system 501 and airtightly connected to the transfer chamber 4 through a gate valve 502. Two heat stages 51 are disposed in the degas chamber 5. Each of the heat stages 51 has a substantially cylindrical shape of low height. The heat stages 51 have the same diameter. One of the substrates 10 is placed on the upper face of each stage and the substrate 10 is then heated.

A heating unit 511 is disposed in each of the heat stages 51. For example, a heating device based on radiation heating, such as a heating lamp or a ceramic heater may be used as the heating unit 511. The heat stage 51 is heated by radiation rays emitted from the heating unit, so that the substrate 10 placed on the upper face is heated by heat conduction via the upper face.

A delivering mechanism 52 which performs supply and reception of the substrate 10 between an arm 411 of the transfer robot 41 and each of the heat stages 51 is disposed in the degas chamber 5. The delivering mechanism 52 comprises a pair of support members 521 which are opposed to and separated from each other by a distance corresponding to the diameter of the substrate 10, and a driving mechanism 522 which vertically moves the support members 521 so as to place the substrate 10 on the heat stage 51 and take out therefrom.

On the other hand, two retraction recesses 512 are formed in the peripheral edge of the upper face of each heat stage 51, and have a predetermined depth from the upper face. The retraction recesses 512 are opposed to each other in a diameter direction. When the arm 41 carrying the substrate 10 reaches a position above the heat stage 51 as shown in FIG. 3, the support members 521 are raised so as to support the peripheral edge of the substrate 10. Under this state, the support members 521 are lowered, thereby placing the substrate 10 on the heat stage 51. At this time, the lowered support members 521 are retracted into the retraction recesses 512 as shown in FIG. 3.

Next, other portions of the sputtering apparatus of the embodiment will be briefly described with reference to FIGS. 1 and 2.

Each of the sputter chambers 1A, 1B, 1C, and 1D is a vacuum vessel having an exhaust system 11 and airtightly connected to the transfer chamber 4 through a gate valve 101. A cathode 12 and a substrate holder 13 are opposed to each other in each sputter chamber 1. Each sputter chamber comprises a sputter power source 15 which applies a predetermined voltage (a negative DC voltage or a high-frequency voltage) to the cathode 12, and a gas introducing system 14 which introduces a predetermined gas for sputtering. A target 121 disposed in the cathode 12 is made of a predetermined material corresponding to the material which is to be deposited as a film.

A heating unit 131 is incorporated in the substrate holder 13 so as to heat the substrate 10 to about 100 to 500° C. during the film deposition. In the same manner as the heating unit 511 of the degas chamber 5, a heating device based on radiation heating may be used as the heating unit 131. Alternatively, a device based on resistance heating such as a tungsten heater may be embedded in the holder.

The transfer robot 41 which is disposed in the transfer chamber 4 and functions as a transferring mechanism is configured so as to transfer the substrate 10 while supporting the substrate on the upper face of the arm 411. The arm 411 of the transfer robot 41 can make a horizontal linear movement, a vertical movement, a rotational movement about a vertical axis while electrostatically attracting and holding the substrate 10.

The etching chamber 6 shown in FIG. 1 is a process chamber in which an oxide film and the like on the surface of the substrate 10 are etched away prior to sputtering. Various configurations may be used for performing the etching. For example, used is a configuration in which a high-frequency discharge or the like is caused in a gas such as argon to generate a plasma and a predetermined bias voltage is applied to the substrate 10, thereby subjecting the surface of the substrate 10 to sputter etching.

Outside the load-lock chamber 2 and the unload-lock chamber 3 which are adjacent to each other, an automatic loading mechanism and an automatic unloading mechanism which are not shown are respectively disposed. The automatic loading mechanism automatically loads the substrate 10 from a carrier cassette (not shown) into the substrate cassette 21 in the load-lock chamber 2. The automatic unloading mechanism automatically unloads or recovers the substrates 10 from the substrate cassette 31 in the unload-lock chamber 3 to the carrier cassette (not shown).

Next, the operation of the thus configured multichamber sputtering apparatus of the embodiment will be described. In the following description, for example, it is assumed that a sputtering process for forming channel wirings in a MOS-FET circuit is conducted.

First, the automatic loading mechanism loads a predetermined number of substrates 10 into the substrate cassette 21 in the load-lock chamber 2. The gate valve at the entrance is closed and the load-lock chamber 2 is exhausted to a predetermined pressure.

Next, the gate valve on the side of the transfer chamber 4 is opened, and the transfer robot 41 takes out the first substrate 10 from the substrate cassette 21 and then transfers the substrate to the degas chamber 5. The substrate 10 is placed on one of the heat stages 51 in the manner described above. In succession, the transfer robot 41 takes out the second substrate 10 from the substrate cassette 21 and then transfers the substrate to the degas chamber 5. The same operation is conducted, and the substrate 10 is placed on the other heat stage 51. The two substrates 10 are simultaneously heated on the two heat stages 51, so that impurities such as water and oxygen molecules contained in the substrates 10 separate from the substrates 10. For example, the substrates are heated to a temperature of about 200 to 250° C. and for a period of about 60 to 120 seconds.

After heating of a predetermined period is ended, the transfer robot 41 takes out one by one the substrates 10 from the degas chamber 5 and transfers the substrates to the etching chamber 6. The substrates 10 are subjected to etching in the etching chamber 6 so that an oxide film and the like on the surface are etched away. Thereafter, the substrates are transferred to the sputter chambers 1A, 1B, 1C, and 1D in which sputtering is conducted.

At this time, a substrate holder which can simultaneously hold two substrates 10 may be disposed in the etching chamber 6 so that the two substrates 10 simultaneously undergo the etching process. Alternatively, during the etching process of one of the substrates 10, the another substrate 10 may wait in the transfer chamber 4 or the degas chamber 5 so that the substrates are subjected one by one to the etching process.

The sputtering process-may be similarly conducted. Namely, sputtering may be conducted while one substrate is transferred to the four sputter chambers 1A, 1B, 1C, and 1D in this sequence. Alternatively, the four sputter chambers 1A, 1B, 1C, and 1D may be configured into two groups each consisting of two chambers. In this case, in each group, the same sputtering process is conducted, so that two substrates 10 undergo the same sputtering process in parallel.

After a thin film is deposited in the sputter chambers 1A, 1B, 1C, and 1D as described above, the substrate 10 is transferred to the unload-lock chamber 3, and then housed in the substrate cassette 31. In this way, the substrates 10 are taken out one by one from the load-lock chamber 2, sputtering is conducted while the substrates 10 are sequentially transferred to the process chambers, and the substrates 10 are then recovered to the unload-lock chamber 3. When all the substrates 10 which have been housed in the substrate cassette 21 in the load-lock chamber 2 are recovered to the substrate cassette 31 in the unload-lock chamber 3, a vent gas introducing system 35 of the unload-lock chamber 3 operates so that the interior of the unload-lock chamber 3 is returned to the atmospheric pressure. Thereafter, a gate valve 36 is opened and the automatic unloading mechanism automatically recovers the substrates 10 to the carrier cassette.

In the multichamber sputtering apparatus of the embodiment which is configured and operates as described above, since the degas chamber 5 comprises the two heat stages 51, the productivity of the degas process which tends to require a prolonged period is doubled. This can largely improve the productivity of the whole of the sputtering process.

When one further degas chamber 5 is additionally disposed, the same effect may be attained. However, such an addition of the degas chamber 5 requires the transfer chamber 4 to be increased in size, thereby causing a problem in that the floor space for installing the apparatus is increased. Consequently, the addition of the degas chamber is disadvantageous from the viewpoint of equipment investment. In contrast, the configuration of the embodiment can reduce the space and hence can be expected to attain a large side effect in equipment investment.

Next, other embodiments of the invention will be described. The apparatuses of the embodiments described below are identical with the embodiment described above except the configuration of the heat stages 51.

Figure 4:
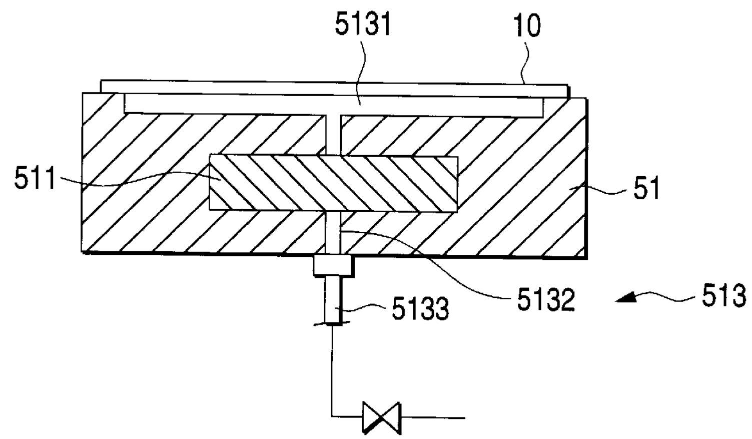
FIG. 4 is a perspective view schematically illustrating the configuration of a heat stage used in a sputtering apparatus of a second embodiment of the invention.

FIG. 4 is a perspective view schematically illustrating the configuration of the heat stage used in the sputtering apparatus of a second embodiment of the invention.

In the embodiment, the heat stage 51 comprises a heating gas introducing unit 513 for introducing a heating gas causing the heating gas to make contact with the rear face of the substrate 10. A groove or recess 5131 into which the heating gas is to be introduced is formed in the upper face of the heat stage 51. A communication hole 5132 which communicates with the groove or recess 5131 is passed through the heat stage 51. A pipe 5133 for supplying the heating gas is connected to the communication hole 5132. The groove or recess 5131 in the upper face of the heat stage 51 is formed in such a manner that, when the substrate 10 is placed on the heat stage, the groove or recess is closed by the substrate 10.

The heating gas which is introduced into the groove or recess 5131 through the communication hole 5132 makes contact with the rear face of the substrate 10 to exchange heat, and satisfactorily transmits heat to the heat stage 51. As a result, the efficiency of the operation of heating the substrate 10 exerted by the heat stage 51 is improved and the period required for the heating operation can be shortened. When the rear face of the substrate 10 fails to make complete surface contact with the upper face of the heat stage 51, a small gap is formed between them. In such a case, the heat transfer by conduction cannot be attained with respect to the gap portion because of the vacuum environment, and the heat transfer is attained only by radiation. However, when a heating gas is introduced as in the case of the embodiment, convection and the like occur so that the heating gas transfers the heat of the heat stage 51 to the substrate 10, thereby improving the heating efficiency.

As the heating gas, a rare gas or an inert gas such as argon, nitrogen, or helium is preferably used. The pressure of the heating gas under the state where the gas is introduced into the groove or recess 5131 is, for example, about 5 to 10 Torr. Even when the heating gas at room temperature is used, it is possible to attain the effect. When the heating gas at a temperature higher than room temperature is used, however, the effect is further enhanced.

Figure 5:
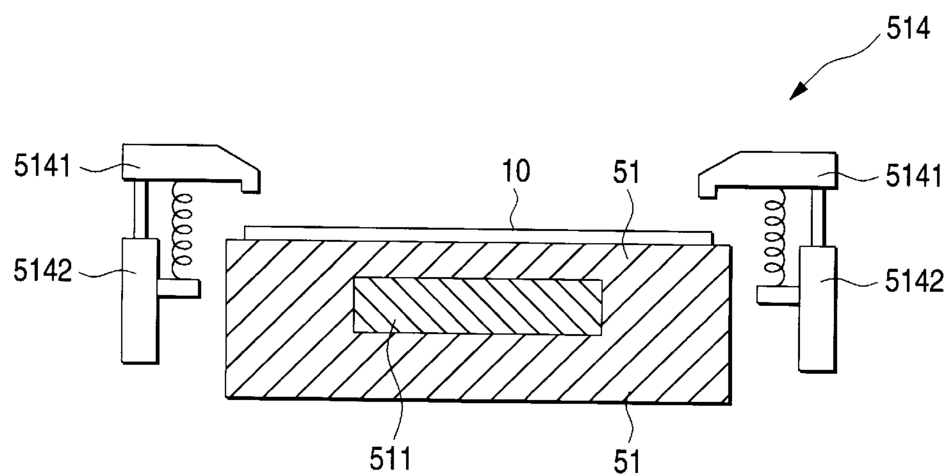
FIG. 5 is a section view schematically illustrating the configuration of a heat stage used in a sputtering apparatus of a third embodiment of the invention.

FIG. 5 is a section view schematically illustrating the configuration of the heat stage used in the sputtering apparatus of a third embodiment of the invention. In the third embodiment, a pressing mechanism 514 which presses the substrate 10 against the heat stage 51 so as to enhance the surface contact is disposed.

The pressing mechanism 514 comprises an annular pressing member 5141 of a size corresponding to the outer diameter of the substrate 10, and a driving mechanism 5142 which drives the pressing member 5141. The driving mechanism 5142 comprises a spring which exerts an elastic force to the heat stage 51, and a push rod which pushes up the pressing member 5141 against the force of the spring.

When the arm 411 of the transfer robot 41 places the substrate 10 on the heat stage 51, the driving mechanism 5142 downward moves the pressing member 5141 so that the pressing member is placed on the periphery of the substrate 10. This enhances the surface contact between the substrate 10 and the heat stage 51, thereby improving the heating efficiency. The pressing member 5141 is configured so as to press the margin portion in the periphery of the substrate 10 where no device is to be formed.

Figure 6:
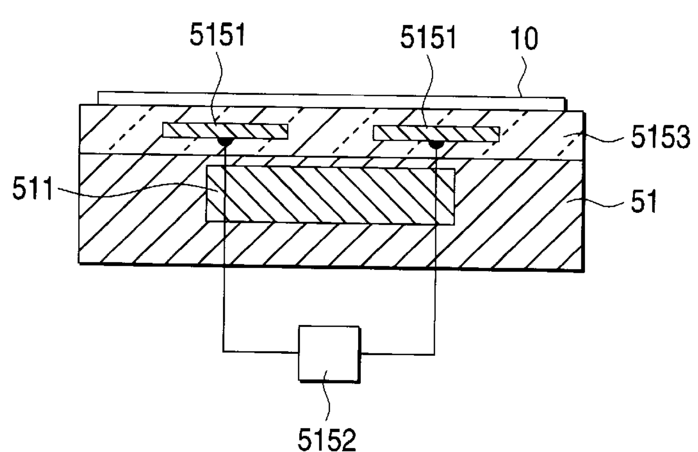
FIG. 6 is a section view schematically illustrating the configuration of a heat stage used in a sputtering apparatus of a fourth embodiment of the invention.

FIG. 6 is a section view schematically illustrating the configuration of the heat stage used in the sputtering apparatus of a fourth embodiment of the invention. In the fourth embodiment, an electrostatic chucking mechanism is disposed in order to enhance the surface contact between the substrate 10 and the heat stage 51. Specifically, a dielectric block 5153 is formed on the substrate-placing face of the heat stage 51 so as to exhibit excellent heat conductivity. A pair of chucking electrodes 5151 are embedded in the dielectric block 5153. A chucking power source 5152 which applies a predetermined voltage to the chucking electrodes 5151 is connected to the chucking electrodes 5151. In order to protect the surface and adjust the dielectric constant, a dielectric film (not shown) which is made of aluminum nitride or the like and has a thickness of about 5 to 10 μm is formed on the upper face of the dielectric block 5153. Preferably, the thicknesses of the dielectric block 5153 and the dielectric film are set to be as small as possible in the range where a required chucking effect is attained so as to greatly lower the heat conductivity.

According to the fourth embodiment, since the surface contact between the substrate 10 and the heat stage 51 is enhanced, the heating efficiency is improved, with the result that the period required for heating can be shortened.

Next, an example of the invention applied to a specific sputtering process will be described.

Figure 7:
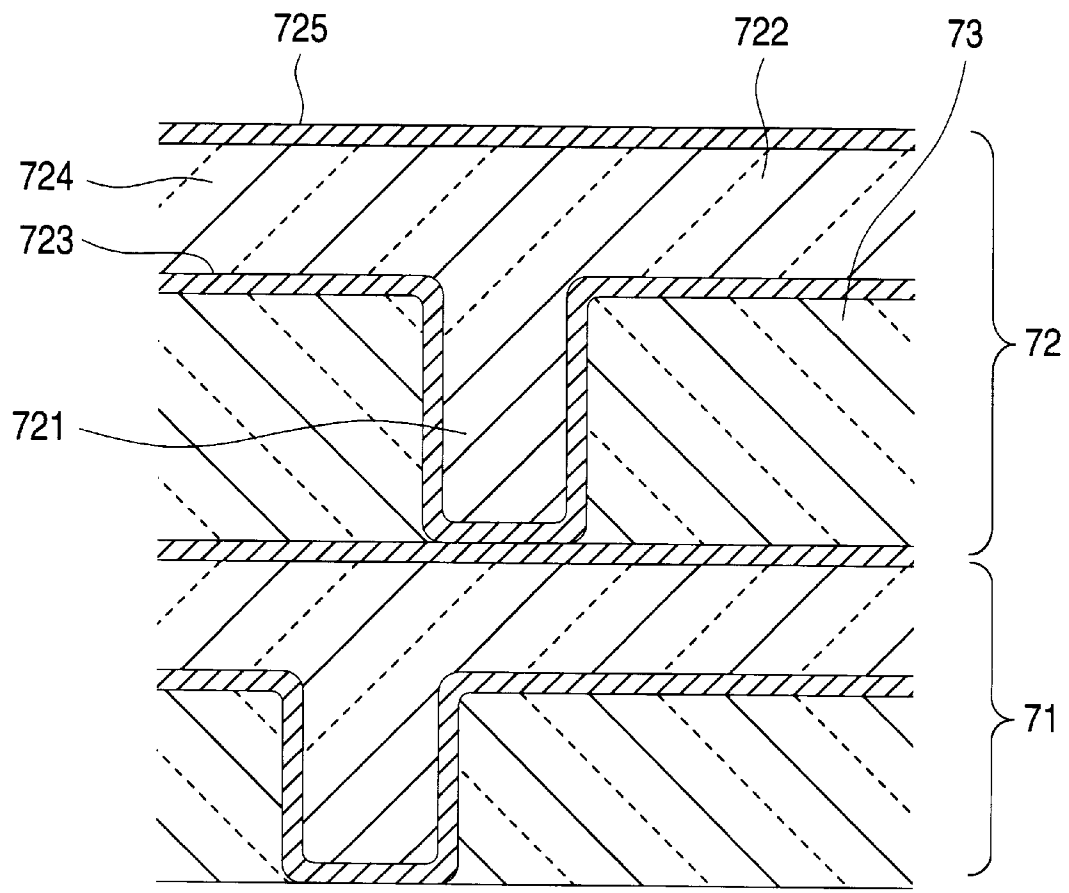
FIG. 7 is a schematic section view illustrating a sputtering process using the apparatuses of the embodiments and showing a multilayer wiring structure which is employed in an integrated circuit such as a DRAM.

FIG. 7 is a schematic section view illustrating a sputtering process using the apparatuses of the embodiments and showing a multilayer wiring structure which is employed in an integrated circuit such as a DRAM. In the multilayer wiring structure shown in FIG. 7, a second layer wiring 72 is formed on a first layer wiring 71 which is formed in the upper layer of a device portion (not shown). For example, the portion of the second layer wiring 72 is formed by using one of the sputtering apparatuses described above. The second layer wiring 72 consists of an interlayer wiring portion 721 which is formed so as to fill a through hole in a interlayer insulating film 73 insulating the first and second layers from each other, and a main wiring portion 722 formed on the upper face of the interlayer insulating film.

When the second layer wiring 72 is to be formed, the substrate 10 on which the first layer wiring 71 is formed undergoes the degas and etching processes as described above, and the substrate 10 is then transferred to the sputter chamber 1A. In the sputter chamber 1A, a Ti film 723 is first deposited as an underlying layer. The thickness of the film is, for example, about 1,000 Å.

Next, the substrate 10 is transferred to the sputter chamber 1B and subjected to high-temperature Al sputtering. Specifically, the aluminum target is sputtered while heating the substrate 10 to about 400° C., and an Al wiring film 724 is deposited. During this process, aluminum on the substrate 10 is increased in fluidity by the heat of the substrate 10 and sufficient aluminum liner is formed on the interior of a through hole to fill the through hole.

In the sputter chamber 1B, sputtering is conducted until the Al wiring film 724 (the thickness of the main wiring portion) has a thickness of, for example, 8,000 to 10,000 Å. Thereafter, the substrate 10 is transferred to the sputter chamber 1D. In the sputter chamber 1D, the substrate 10 is cooled to a predetermined temperature, and a TiN film 725 is then deposited. The deposition of the TiN film 725 is conducted in order to prevent mutual diffusion of the film and a further upper layer from occurring. For example, the TiN film is formed so as to have a thickness of about 400 to 500 Å. The substrate 10 may be naturally cooled in the sputter chamber 1D. Alternatively, the substrate 10 may be placed on a cooling stage disposed in the sputter chamber 1D, or a cooling gas may be blown to the substrate 10 in order to cool the substrate.

In this way, the second layer wiring 72 is formed into a sandwich structure in which the thin Ti underlying film 723 is disposed below the Al wiring film 724 and the thin TiN barrier film 725 is disposed on the Al wiring film. It is a matter of course that the first layer wiring 71 may be formed in the same process. In-the above-described example, the sputter chamber 1C is not used. Depending on factors such as the thickness of the Al wiring film, there may be a case where the deposition of the Al wiring film is conducted for a half of the thickness in the sputter chamber 1B and the film deposition for the remaining half of the thickness is conducted in the sputter chamber 1C.

Next, specific values for improvement of the productivity in the example will be described. When the Al wiring process is conducted in the example, the process is usually conducted in the following process periods:

(1) degas (the degas chamber 5): 120 seconds
(2) etching (the etching chamber 6): 60 seconds
(3) TiN sputtering (the sputter chamber 1A): 60 seconds
(4) high-temperature Al sputtering (the sputter chambers 1B and 1C): 120 seconds
(5) cooling and TiN sputtering (the sputter chamber 1D): 60 seconds.

In the high-temperature Al sputtering in (4) above, sputtering is first conducted for 60 seconds in the sputter chamber 1B and then for 60 seconds in the sputter chamber 1C, or two substrates are processed-in parallel in the two sputter chambers 1B and 1C, respectively.

When the above-described process is conducted by using a multichamber sputtering apparatus in which a single heat stage 51 is disposed in the degas chamber 5, the throughput (the number of wafers which can be processed per hour) is about 26 substrates per hour. The throughput is about 50% of that of a standard process which does not use a high-temperature process, thereby causing a large problem in productivity.

On the other hand, when two heat stages 51 are disposed in the degas chamber 5 as in the apparatuses of the embodiments, the throughput is remarkably improved or about 40 substrates per hour. Specifically, a first substrate 10 is placed on one heat stage 51, a second substrate 10 is placed on the other heat stage 51 after an elapse of 60 seconds, the first substrate 10 is taken out from the one heat stage 51 and transferred to the etching chamber 6 after a further elapse of 60 seconds, and the second substrate 10 is transferred to the etching chamber 6 after a further elapse of 60 seconds.

According to this operation, the process period of the degas chamber 5 is apparently 60 seconds for one substrate, and the productivity of the degas process is doubled. It is a matter of course that two substrates 10 may be simultaneously placed on the two heat stages 51 and the two substrates 10 may be taken out after an elapse of 120 seconds.

In the above description, two heat stages are used. Alternatively, three, four, or more heat stages may be disposed in one degas chamber 5. As the number of heat stages is increased, the productivity of the degas process is further improved.

The degas process may be sometimes conducted with previously heating the substrate with the objective of improving the adhesion between the film to be deposited and the foundation or stabilizing the properties such as the specific resistivity of the film, in addition to the objective of ensuring the fluidity of the wiring material during the high-temperature sputtering.

In the above, aluminum is used as an example of the wiring material. Alternatively, tungsten or the like may be used. In the alternative, sputtering is conducted while using a target made of tungsten.

As described above, according to the invention, since the degas chamber comprises a plurality of heat stages, the productivity of the degas process which tends to require a prolonged period is remarkably improved, and this can largely improve the productivity of the whole of the sputtering process. As compared with the case where two or more degas chambers are used, the area occupied by the apparatus can be reduced and it is expected to attain a large side effect also in the viewpoint of equipment investment.

What is claimed is:

1. A multichamber sputtering apparatus comprising a transfer chamber and a plurality of process chambers which are airtightly connected to and arranged around said transfer chamber, in which processes are continuously conducted in a vacuum, said process chambers comprising:

a sputter chamber for sputtering; and a degas chamber for degassing a substrate, said degas chamber being provided with a plurality of heat stages so as to simultaneously heat a plurality-of substrates.

2. The multichamber sputtering apparatus according to claim 1, wherein each of said heat stages is provided with a heating gas introducing unit for introducing a heating gas causing the heating gas to make contact with a rear face of a substrate.

3. The multichamber sputtering apparatus according to claim 2, wherein said heating gas introducing unit comprises: a groove into which the heating gas is to be introduced, said groove being formed in an upper face of the corresponding heat stage; a communication hole which communicates with said groove and is passed through the corresponding heat stage; and a pipe connected to said communication hole to supply the heating gas thereto.

4. The multichamber sputtering apparatus according to claim 2, wherein said heating gas introducing unit comprises: a recess into which the heating gas is to be introduced, said recess being formed in an upper face of the corresponding heat stage; a communication hole which communicates with said recess and is passed through the heat stage; and a pipe connected to said communication hole to supply the heating gas thereto.

5. The multichamber sputtering apparatus according to claim 1, wherein each of said heat stages is provided with a pressing mechanism for mechanically pressing a substrate against a surface of the corresponding heat stage.

6. The multichamber sputtering apparatus according to claim 5, wherein said pressing mechanism comprises: an annular pressing member of a size corresponding to an outer diameter of the substrate; and a driving mechanism for driving said pressing member.

7. The multichamber sputtering apparatus according to claim 1, wherein each of said heat stages is provided with an electrostatic chucking mechanism for causing a substrate to be attracted to a surface of the corresponding heat stage by means of electrostatic attraction.

8. The multichamber sputtering apparatus according to claim 7, wherein said electrostatic chucking mechanism comprises: a dielectric block formed on a substrate-placing face of the corresponding heat stage; a pair of chucking electrodes embedded in said dielectric block; and a chucking power source for applying a voltage to said chucking electrodes.

9. The multichamber sputtering apparatus according to claim 1, wherein said sputter chamber is provided with a target of an aluminum material, and a heating unit for heating a substrate to a temperature which is substantially equal to a melting point of the aluminum material, thereby fluidifying the aluminum material which reaches the substrate.

10. A multichamber sputtering apparatus comprising a transfer chamber and a plurality of process chambers which are airtightly connected to and arranged around said transfer chamber, in which processes are continuously conducted in a vacuum, said process chambers comprising:

a sputter chamber for sputtering; and a degas chamber for degassing a substrate, said degas chamber being provided with only a plurality of heat stages so as to simultaneously heat a plurality of substrates.

* * * * *